United States Patent
Nakagawa et al.

(10) Patent No.: US 6,760,271 B2
(45) Date of Patent: Jul. 6, 2004

(54) SEMICONDUCTOR MEMORY DEVICE WITH SHORTER SIGNAL LINES

(75) Inventors: Harunobu Nakagawa, Kawasaki (JP); Yasushi Oka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/810,499

(22) Filed: Mar. 19, 2001

(65) Prior Publication Data

US 2002/0024870 A1 Feb. 28, 2002

(30) Foreign Application Priority Data

Jul. 28, 2000 (JP) ........................................ 2000-229690

(51) Int. Cl.[7] ................................................ G11C 8/00
(52) U.S. Cl. ............. 365/230.03; 365/218; 365/185.11; 365/185.29; 365/189.04
(58) Field of Search .............................. 365/230.03, 218, 365/185.11, 185.29, 189.04, 235, 185.33

(56) References Cited

U.S. PATENT DOCUMENTS

| | | | | |
|---|---|---|---|---|
| 5,280,447 A | * | 1/1994 | Hazen et al. ............... | 365/185 |
| 5,305,284 A | | 4/1994 | Iwase ....................... | 365/238.5 |
| 5,734,816 A | * | 3/1998 | Niijima et al. .................. | 714/8 |
| 5,751,657 A | * | 5/1998 | Hotta ....................... | 365/238.5 |
| 5,831,903 A | * | 11/1998 | Ohuchi et al. ......... | 365/185.22 |
| 5,986,933 A | * | 11/1999 | Takeuchi et al. ........ | 365/185.12 |
| 6,011,720 A | * | 1/2000 | Tanaka ................... | 365/185.22 |
| 6,377,502 B1 | * | 4/2002 | Honda et al. .......... | 365/230.03 |
| 6,466,484 B1 | * | 10/2002 | Sakakibara et al. ..... | 365/185.29 |
| 6,512,693 B2 | * | 1/2003 | Honda et al. .......... | 365/185.13 |
| 6,532,181 B2 | * | 3/2003 | Saito et al. .................. | 365/200 |
| 6,549,474 B2 | * | 4/2003 | Liu ........................ | 365/189.11 |

FOREIGN PATENT DOCUMENTS

JP        11339473 A       12/1999

* cited by examiner

Primary Examiner—Connie C. Yoha
(74) Attorney, Agent, or Firm—Arent Fox, PLLC

(57) ABSTRACT

A semiconductor memory device includes a plurality of input/output terminals, a memory cell array which are divided into blocks respectively corresponding to the input/output terminals such that only one of the blocks corresponds to a given one of the input/output terminals, sense amplifiers, which are connected to the blocks at a side thereof, and amplify data of the memory cell array, switches which are respectively connected to the sense amplifiers, and signal lines, which connect the sense amplifiers to a corresponding one of the input/output terminals via the switches.

6 Claims, 9 Drawing Sheets

SEMICONDUCTOR MEMORY DEVICE WITH SHORTER SIGNAL LINES

BACKGROUND OF THE INVENTION

1. Field of the Invention

The present invention generally relates to semiconductor memory devices, and particularly relates to a page-mode memory device that allows a plurality of pages to be accessed at high speed.

2. Description of the Related Art

Page-mode memory devices allow high-speed data write/read operation to be performed with respect to a memory cell array. In page-mode memory devices, data is read from a plurality of pages at once to be stored in the sense amplifiers, and an address is provided from an exterior of the device to specify a page, thereby reading the data of the specified page at high speed. As long as the specified page is one of the plurality of pages that have been read at once, all that is required is to read data from the sense amplifiers, and there is no need to read data by accessing the memory cell array each time a page is specified. This shortens a time period from the address input to the data output, thereby achieving high-speed data read operation.

FIG. 1 is an illustrative drawing showing a configuration of a related-art page-mode memory.

A memory cell array 10 is divided into four pages Page0 through Page3, and each page is further divided into portions corresponding to respective input/output terminals. For example, an input/output terminal I/O0 is coupled to a corresponding portion of each memory cell array through a corresponding input/output buffer 11 and a corresponding sense amplifier 12. The same applies in the case of other input/output terminals. In this manner, each input/output terminal is coupled to all of these four pages Page0 through Page3.

At the time of data read operation, data of all the pages Page0 through Page 3 are read and stored in the sense amplifiers 12. Thereafter, switches 13 for a selected page is switched on to supply the data of the selected page to an exterior of the memory device.

At the time of data write operation, all input/output terminals that correspond to a selected address are treated as one unit, and data is provided to perform write operation.

In the configuration of FIG. 1, the input/output buffers 11 are connected to the corresponding sense amplifiers 12 via signal lines 14. Since each input/output terminal needs to be coupled to all the pages, the signal lines 14 tend to extend a long distance in commensurate with the spatial extension of the memory cell array corresponding to the four pages Page0 through Page3.

Accordingly, wire resistance and capacitance of the signal lines 14 tend to be great, resulting in long signal delays. This causes a decrease in data write/read operation speed, hindering an effort toward the higher operation speed of memory chips.

Accordingly, there is a need for a semiconductor memory device that can achieve high-speed operation by reducing wire resistance and capacitance of signal lines associated with the input/output section of the memory device.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device including a plurality of input/output terminals, a memory cell array which are divided into blocks respectively corresponding to the input/output terminals such that only one of the blocks corresponds to a given one of the input/output terminals, sense amplifiers, which are connected to the blocks at a side thereof, and amplify data of the memory cell array, switches which are respectively connected to the sense amplifiers, and signal lines, which connect the sense amplifiers to a corresponding one of the input/output terminals via the switches.

According to the present invention as described above, a given input/output terminal is coupled to only one block of the memory cell array where this one block corresponds to this input/output terminal, so that the signal lines connecting the input/output terminal to the sense amplifiers suffice if they have a line length substantially comparable to the spatial extension of the block. In other words, the signal lines connecting the input/output terminal to the sense amplifiers only need to be coupled to the sense amplifiers corresponding to the plurality of pages, so that a length of the signal lines are sufficient if it is comparable to the spatial extension of these sense amplifiers arranged adjacent to one another. Accordingly, the semiconductor memory device of the present invention can achieve high-speed operation by reducing wire resistance and capacitance of the signal lines associated with the input/output section of the device.

According to another aspect of the present invention, a semiconductor memory device includes an electrically rewritable nonvolatile memory cell array which include a plurality of I/O portions, which are grouped into a plurality of I/O sets, word lines provided separately for respective ones of the I/O sets, and word-line drivers provided separately for the respective ones of the I/O sets, wherein the word lines are activated in all the I/O sets during a read operation, and are activated in at least one but not all of the I/O sets during a write operation.

The present invention described above reduces a stress that is applied to the gates of memory cells during write operation when the word lines are activated to a high potential. This helps to improve reliability of the data.

DESCRIPTION OF THE PREFERRED EMBODIMENTS

In the following, embodiments of the present invention will be described with reference to the accompanying drawings.

Figure 2:
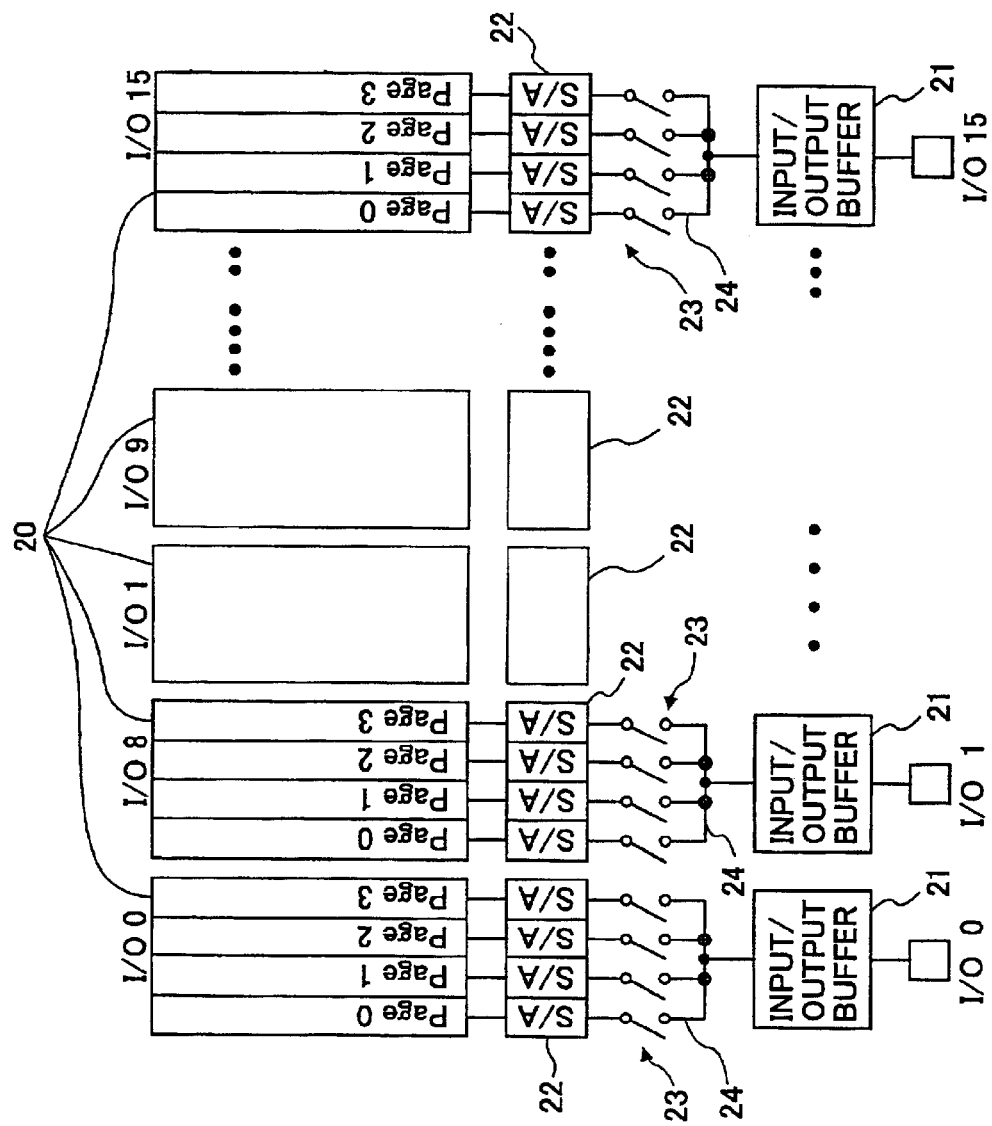
FIG. 2 is an illustrative drawing showing a configuration of a semiconductor memory device according to the present invention.

FIG. 2 is an illustrative drawing showing a configuration of a semiconductor memory device according to the present invention.

In the semiconductor memory device of FIG. 2, a memory cell array 20 is divided into a plurality of blocks corresponding to respective input/output terminals, and each block is divided into a plurality of pages. In the example of FIG. 2, the number of pages is four, and each block is divided into pages Page0 through Page3. Hereinafter, the term "block" refers to a block that corresponds to an input/output terminal, unless a contrary description is provided.

For example, an input/output terminal I/O0 is coupled to portions of all the pages provided in the corresponding block through a corresponding input/output buffer 21 and corresponding sense amplifiers 22. The same applies in the case of other input/output terminals. In this manner, each input/output terminal is coupled to all the four pages Page0 through Page3 provided within the corresponding block.

At the time of data read operation, data of all the pages Page0 through Page 3 are read and stored in the sense amplifiers 22. Thereafter, switches 23 for a selected page is switched on to supply the data of the selected page to an exterior of the memory device.

In the configuration of FIG. 2, signal lines 24 need to connect a given input/output terminal to only a corresponding block of the memory cell array 20, so that it is sufficient to have the signal lines 24 of a length corresponding to the spatial extension of the block. In comparison with the configuration of FIG. 1, therefore, the length of the signal lines can be significantly shortened, thereby reducing wire resistance and capacitance of the signal lines. Accordingly, the semiconductor memory device of the present invention can achieve high-speed operation by reducing wire resistance and capacitance of the signal lines associated with the input/output section of the device.

Figure 3:
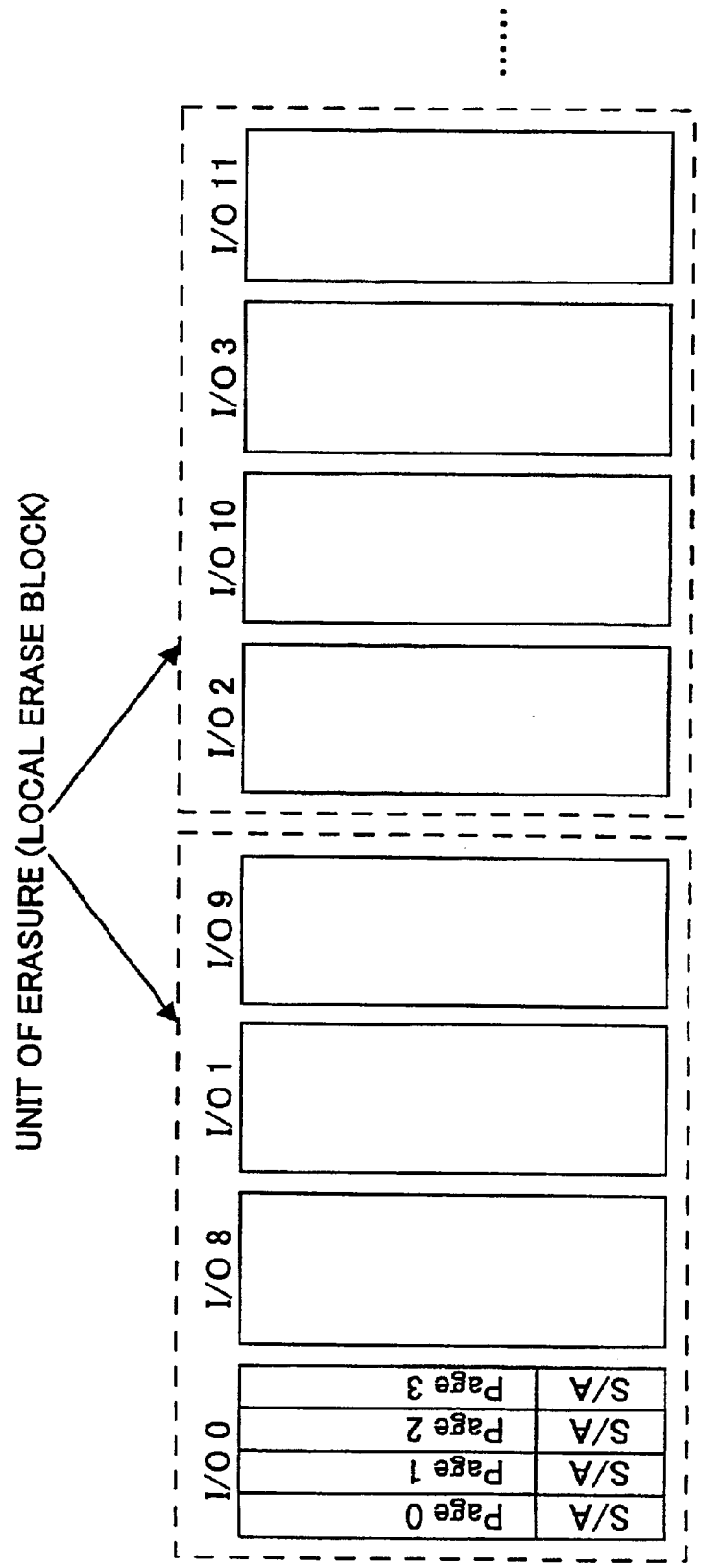
FIG. 3 is an illustrative drawing showing a unit of data erasure when the configuration of FIG. 2 is applied to a flash memory.

FIG. 3 is an illustrative drawing showing a unit of data erasure when the configuration of FIG. 2 is applied to a flash memory.

Figure 1:
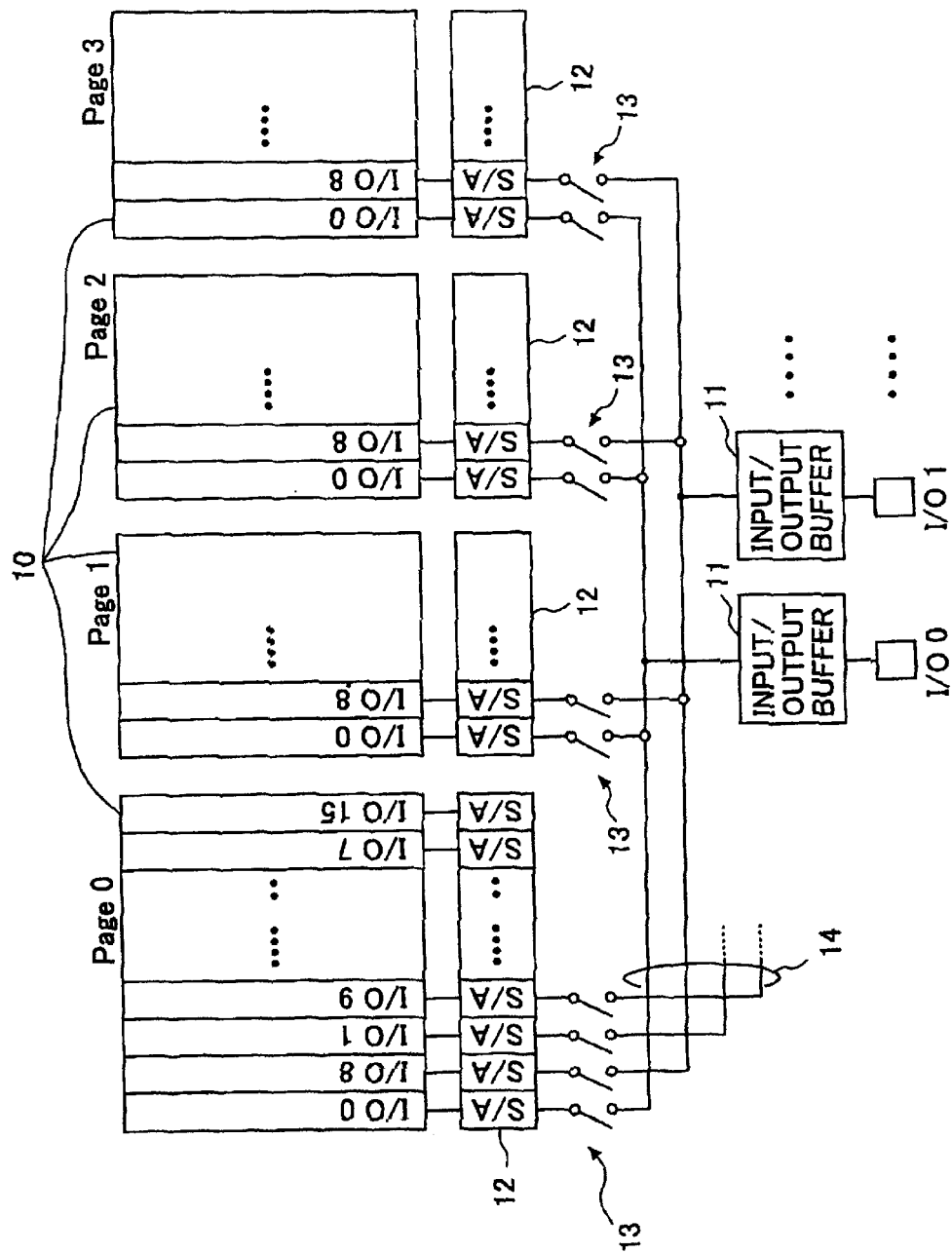
FIG. 1 is an illustrative drawing showing a configuration of a related-art page-mode memory.

In the conventional configuration as shown in FIG. 1, data is erased by the unit of one page. Namely, the pages Page0 through Page 3 are deleted one after another, so that all the pages are deleted after four erasure operations. In the configuration of FIG. 2, however, four blocks are erased at once as a unit of erasure, so that four blocks after four blocks are erased successively. All the blocks are deleted after four erasure operations. Details of this erasure operation will be described later.

Figure 4:
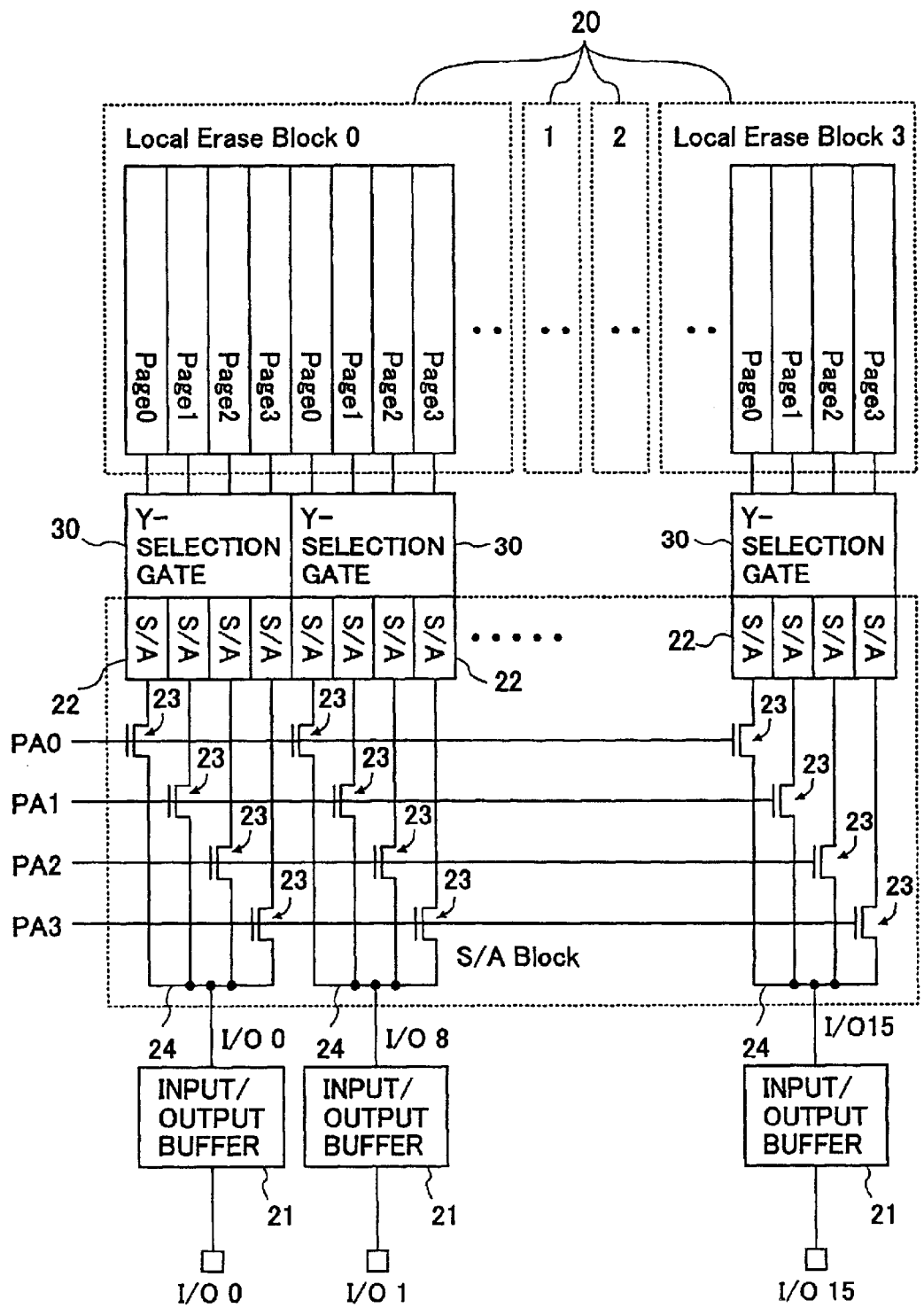
FIG. 4 is a block diagram of a semiconductor memory device according to the present invention.

FIG. 4 is a block diagram of a semiconductor memory device according to the present invention. In the following, an embodiment will be described with reference to an example using a flash memory. The present invention, however, is not limited to use of a flash memory as far as a layout of signal lines as shown in FIG. 2 is concerned. In FIG. 4, the same elements as those of FIG. 2 will be referred to by the same numerals.

In FIG. 4, the memory cell array 20 is coupled to the sense amplifiers 22 through Y-selection gates 30. The sense amplifiers 22 are connected to the input/output buffers 21 via NMOS transistors 23 that function as switches.

At the time of data read operation, data of a selected address are read from each page of the memory cell array 20, and are stored in the sense amplifiers 22. One of the switch signals PA0 through PA3 is turned into HIGH so as to make corresponding NMOS transistors 23 conductive. As a result, one of every four sense amplifiers 22 is selected where every four sense amplifiers 22 form a set that corresponds to four pages. Data of the selected sense amplifiers 22 are supplied to the exterior of the device through the input/output buffers 21.

The signal lines 24 that connect the input/output buffers 21 to the sense amplifiers 22 serve their purpose if they have wire extension corresponding to the spatial extension of one set of sense amplifiers 22. This is because the signal lines 24 are necessary only to connect a given input/output buffer 21 to a corresponding set of four sense amplifiers 22 that correspond to the four pages Page0 through Page3. In this manner, the present invention can achieve high-operation speed by reducing wire resistance and capacitance of the signal lines associated with the input/output of the device.

Figure 5:
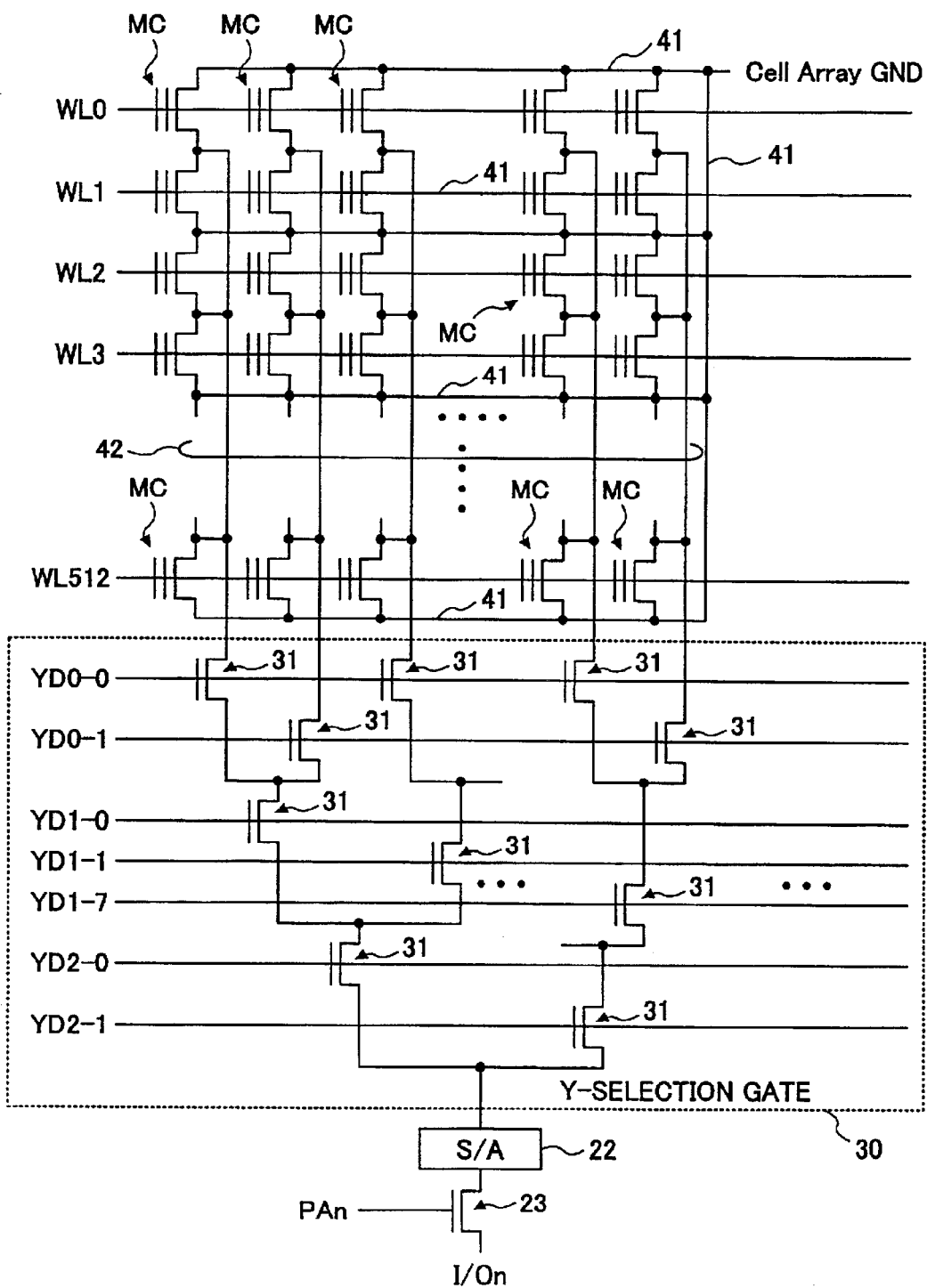
FIG. 5 is a circuit diagram partially showing a detailed configuration of a memory cell array and Y-selection gates.

FIG. 5 is a circuit diagram partially showing a detailed configuration of the memory cell array 20 and the Y-selection gates 30.

In FIG. 5, the memory cell array 20 includes memory cells MC, word lines WL0 through WL512, source lines 41, and bit lines 42. When one of the word lines WL0 through WL512 is selectively activated, data corresponding to program/erase statuses of the memory cells MC appear on the bit lines 42. Namely, when a given memory cell MC is in the erased status, a corresponding bit line 42 is coupled to a source line 41 via this memory cell MC, so that the potential of the bit line 42 falls to the ground potential. When the given memory cell MC is in the programmed status, the bit line 42 is not coupled to the source line 41, and is raised to the HIGH potential by the sense amplifier 22.

The data appearing on the bit lines 42 are subjected to a selection process by the Y-selection gates 30. The Y-selection gates 30 include a plurality of NMOS transistors 31. The NMOS transistors 31 receive at the gates thereof address signals YD0-0 thorugh YD2-1. By making proper settings to the address signals, some of the NMOS transistors 31 are made conductive, thereby selecting one of the bit lines 42. The selected one of the bit lines 42 is thus coupled to the sense amplifier 22.

When data is to be erased, the source lines 41 are set equal to a high potential such as 5 V, and the gate potential (the potential of the word lines) is set equal to a low potential such as −9 V. These potential conditions erase the data of the memory cells MC.

What is shown in FIG. 5 is a configuration corresponding to one page and one sense amplifier 22. If there are four pages in total, the configuration of FIG. 5 is provided as many as four with respect to each input/output buffer.

Figure 6:
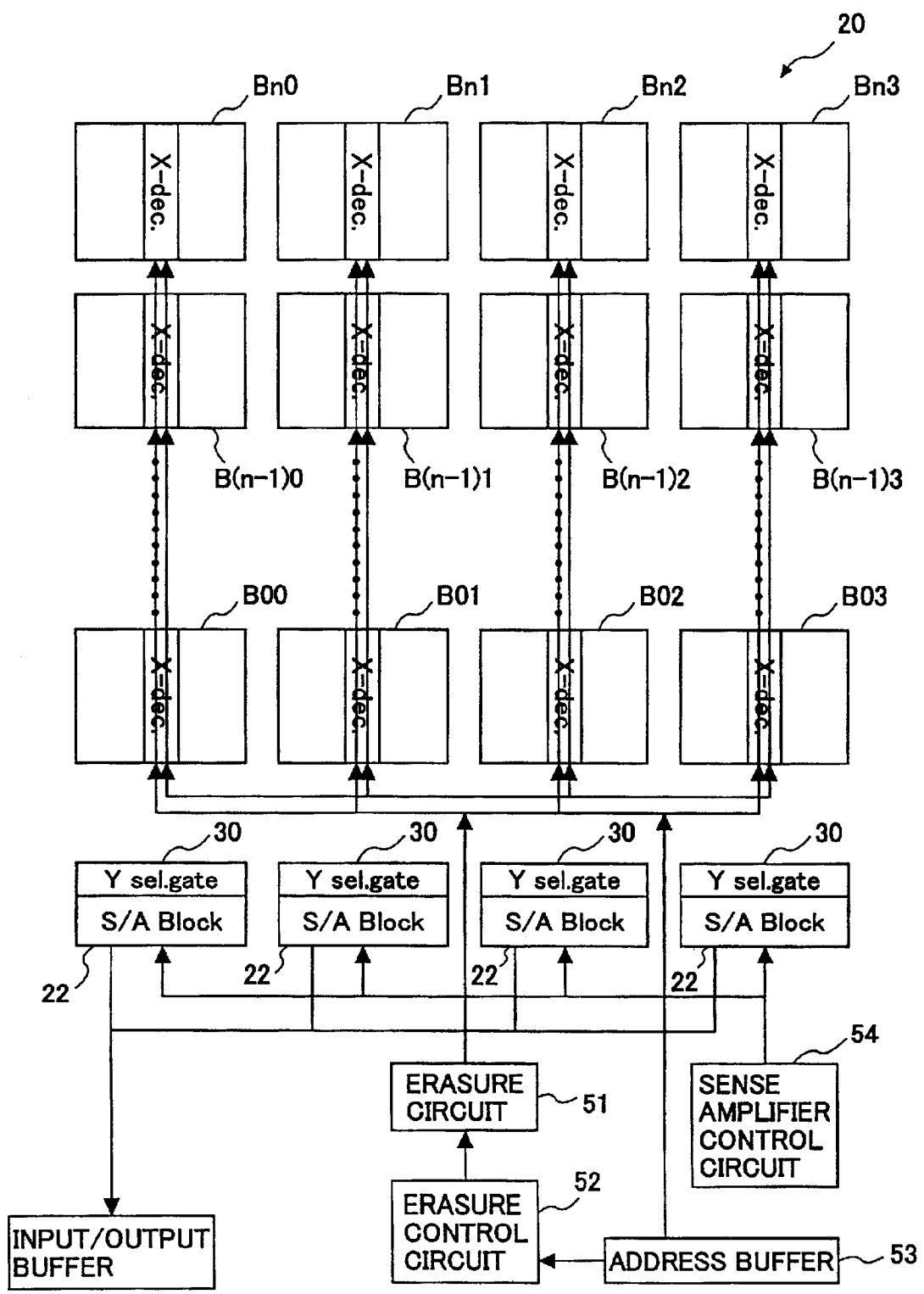
FIG. 6 is a block diagram of a configuration that erases data by a unit of more than one block in the flash memory of the present invention.

FIG. 6 is a block diagram of a configuration that erases data by a unit of more than one block in the flash memory of the embodiment of the present invention.

As shown in FIG. 6, the memory cell array 20 is divided into 4n local erase blocks B00 through Bn3 for control purposes during the memory erasure operation. Here, one local erase block corresponds to one unit of data erasure shown in FIG. 3.

An address buffer 53 is a buffer that stores therein an address for specifying a row and a column of a local erase block that is to be erased. An erasure control circuit 52 controls erasure operation performed on the local erase block, which is specified by the address stored in the address buffer 53. An erasure circuit 51 carries out actual erasure operation on the local erase block under the control of the erasure control circuit 52. A sense amplifier control circuit 54 controls operation of the sense amplifiers 22, and is not directly involved in the erasure of the memory cell array 20.

Each local erase block includes a plurality of I/O blocks (i.e., blocks as shown in FIG. 2 that correspond to respective I/Os), so that erasure of these I/O blocks is carried out at once as one erasure operation. In flash memories, voltages necessary for erasure operation are internally generated by pump circuits within the memory device. If an area of the memory cell array 20 that is to be erased becomes too large, the amount of electrical current needed for the erasure operation may exceed the capacity of the pump circuits. Because of this, erasure operation is performed unit by unit where the unit has a proper size commensurate with the capacity of the pump circuits. In the example of FIG. 6, the unit of erasure operation is one local erase block.

For data erasure, the local erase blocks are erased one after another. For example, a series of erasure operations may erase the local erase blocks B00 through B03. In this case, the local erase block B00 is erased first, and, then, the local erase block B01 is erased by incrementing a column address by one, followed by erasing the local erase block B02, and then erasing the local erase block B03 at the end.

In this manner, all the pages Page0 through Page3 are erased with respect to all the input/output terminals (I/O0 through I/O15 shown in FIG. 4).

In the case of data write operation, the bit lines are set equal to a high potential such as 6 V, and the gate potential (i.e., the potential of the word lines) is set equal to a high potential such as 9 V.

Figure 8:
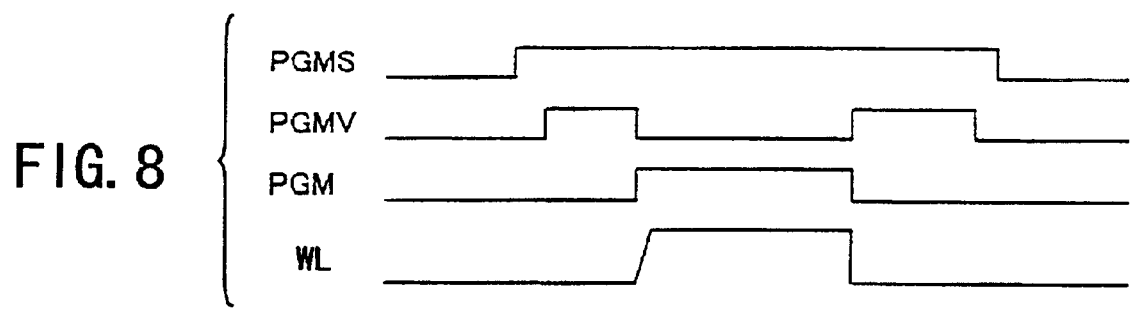
FIG. 8 is a timing chart showing a related-art data-write operation.

In the related art, any given page block is provided with all the I/O portions as shown in FIG. 1, so that write operation needs to be performed to all the pages. Since actual write operation is carried out separately for each I/O on the I/O-specific basis, a word line of each page is kept in the selected high potential state until the entire write operation for all the I/O portions is completed. This results in a stress being applied to the gates of memory cells, which may affect the data. FIG. 8 is a timing chart showing a related-art data-write operation. A PGMS signal is HIGH during the write operation. A program verify operation PGMV for checking the condition of programmed data is performed, and, then, a program operation PGM is carried out if programming is necessary. During this time, the word line WL is activated to a high potential as shown in the figure.

Figure 7:
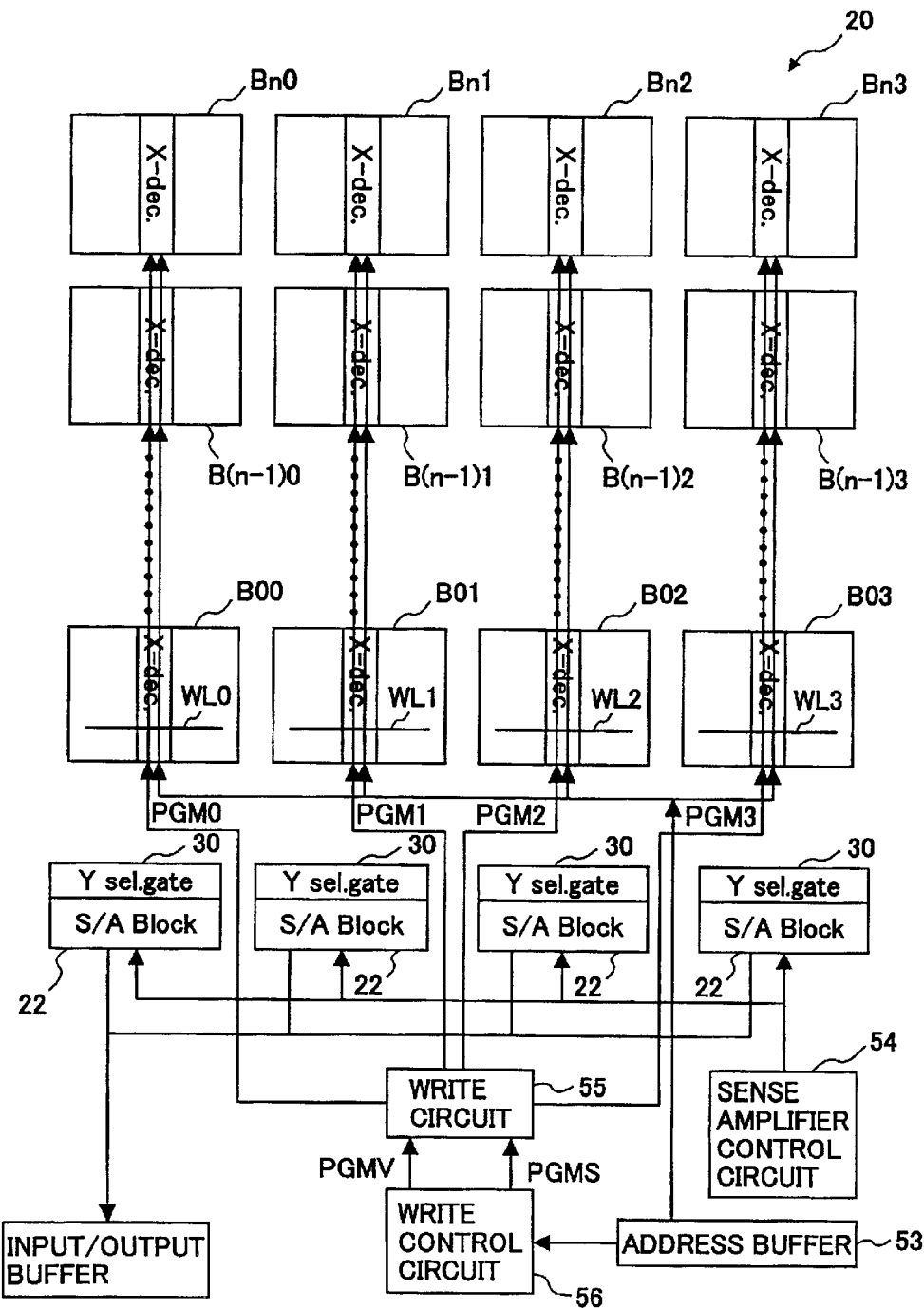
FIG. 7 is a block diagram of a configuration that writes data in the flash memory of the present invention.

FIG. 7 is a block diagram of a configuration that writes data in the flash memory of the embodiment of the present invention. In FIG. 7, the same elements as those of FIG. 6 are referred to by the same numerals, and a description thereof will be omitted.

A write control circuit 56 controls write operation performed on local blocks B00 through B03, which are specified by the address stored in the address buffer 53. A write circuit 55 carries out actual write operation (i.e., program operation) on the local blocks under the control of the write control circuit 56.

In the configuration of FIG. 7 according to the embodiment of the present invention, write operation is performed by the unit of one local block, i.e., by treating a plurality of I/O portions as one unit. Since each local block is provided with a separate driver Xdec for controlling word lines, only a word line WL0 for a local block selected for write operation, for example, the local block B00 may be activated to a high potential while word lines WL1 through WL3 of other local blocks are kept at the ground potential VSS. This reduces a stress applied to the gates of memory cells.

Figure 9:
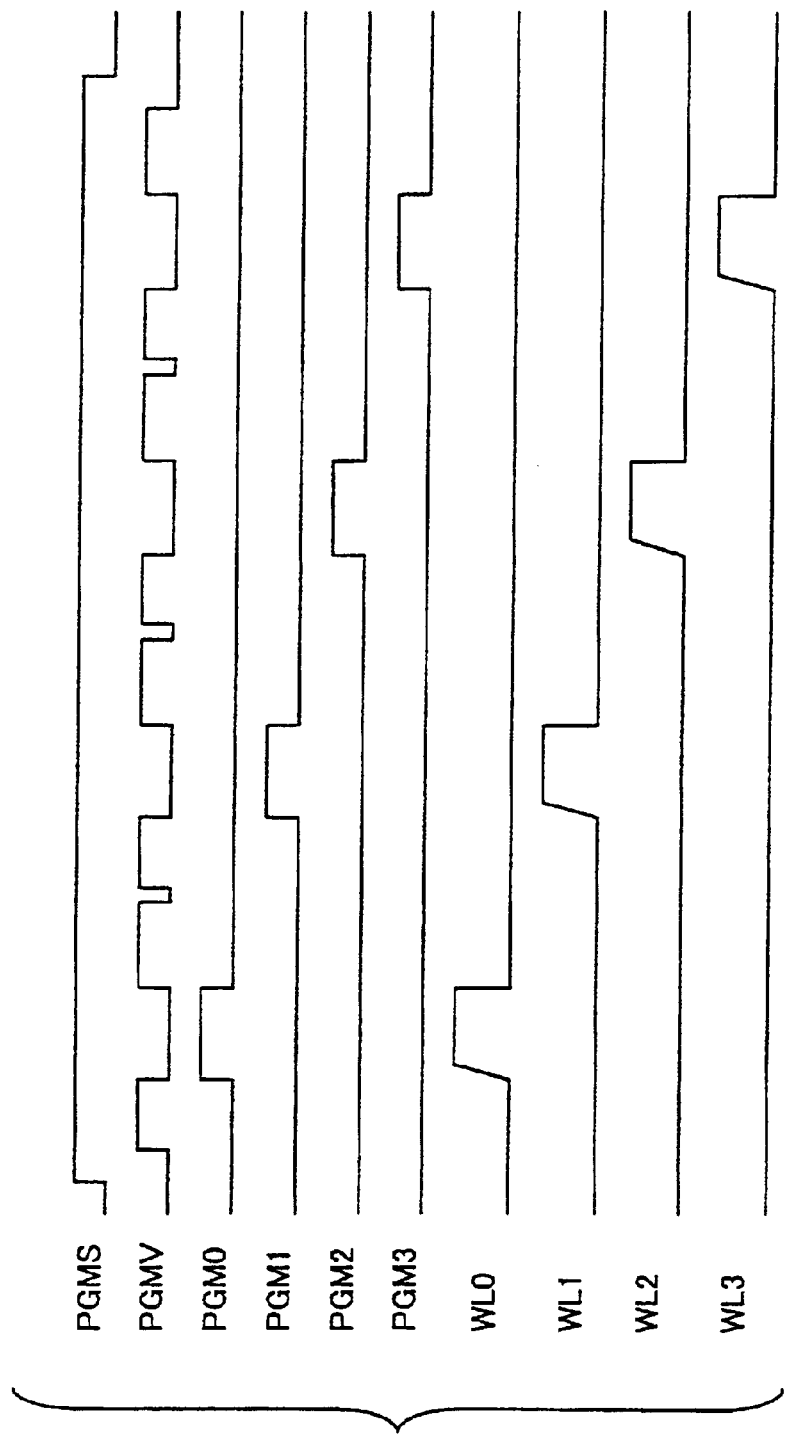
FIG. 9 shows timings of write operation according to an embodiment of the present invention.

FIG. 9 shows timings of the write operation according to the embodiment of the present invention.

A PGMS signal is HIGH during the write operation. A program verify operation PGMV for checking the condition of programmed data is performed, and, then, a program operation PGM0 is carried out if programming is necessary. During this time, the word line WL0 is activated to a high potential as shown in the figure. By the same token, program operations PGM1 through PGM3 are successively performed while the word lines WL1 through WL3 are activated one after another.

Further, the present invention is not limited to these embodiments, but various variations and modifications may be made without departing from the scope of the present invention.

The present application is based on Japanese priority application No. 2000-229690 filed on Jul. 28, 2000, with the Japanese Patent Office, the entire contents of which are hereby incorporated by reference.

What is claimed is:

1. A semiconductor memory device, comprising:
   a plurality of input/output terminals;
   a memory cell array which are divided into blocks respectively corresponding to said input/output terminals such that only one of the blocks corresponds to a given one of said input/output terminals, and each of said blocks is divided into pages;
   sense amplifiers, which are connected to the blocks at a side thereof, and amplify data of said memory cell array;
   switches which are respectively connected to said sense amplifiers; and
   signal lines, which connect said sense amplifiers to a corresponding one of said input/output terminals via the switches, wherein said memory cell array includes flash memory cells, wherein data of said memory cell array is erased by one unit of erasure, wherein more than one but not all of said blocks are put together to form the unit of erasure, so that all the pages included in said blocks which are put together are erased at once.

2. A semiconductor memory device which allows data of a plurality of pages to be read from a memory cell array and stored in sense amplifiers, and allows data of a selected page to be read from the sense amplifiers and output to an exterior of said semiconductor memory device, comprising:
   memory cell areas storing data to be input from and output to one common input/output terminal, said memory cell areas respectively corresponding to the plurality of pages and provided adjacent to each other, wherein the sense amplifiers corresponding to said memory cell areas are arranged adjacent to each other; and
   signal lines which connect the sense amplifiers corresponding to said memory cell areas to the common input/output terminal, wherein the memory cell array includes flash memory cells, wherein data of said memory cell array is erased by one unit of erasure, wherein the unit of erasure is formed by pulling together the memory cell areas for more than one but not all of input/output terminals, so that all the pages included in said unit of erasure are erased at once.

3. The semiconductor memory device as claimed in claim 1, wherein each said unit of erasure is provided with a dedicated word-line driver.

4. The semiconductor memory device as claimed in claim 3, wherein voltages necessary for erasure operation are generated by pump circuits, and said unit of erasure has a size commensurate with the capacity of the pump circuits.

5. The semiconductor memory device as claimed in claim 2, wherein each said unit of erasure is provided with a dedicated word-line driver.

6. The semiconductor memory device as claimed in claim 5, wherein voltages necessary for erasure operation are generated by pump circuits, and said unit of erasure has a size commensurate with the capacity of the pump circuits.

* * * * *